(12) United States Patent
Lin et al.

(10) Patent No.: US 7,099,176 B2
(45) Date of Patent: Aug. 29, 2006

(54) NON-ORTHOGONAL WRITE LINE STRUCTURE IN MRAM

(75) Inventors: Wen Chin Lin, Hsin-Chu (TW); Denny D. Tang, Saratoga, CA (US); Li-Shyue Lai, Jhube (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 137 days.

(21) Appl. No.: 10/827,079

(22) Filed: Apr. 19, 2004

(65) Prior Publication Data

US 2005/0232005 A1   Oct. 20, 2005

(51) Int. Cl.
*G11C 5/08* (2006.01)

(52) U.S. Cl. ............................ 365/67; 365/63; 365/66; 365/173

(58) Field of Classification Search .............. 365/63 X, 365/66 X, 67 O, 171, 173 X
See application file for complete search history.

(56) References Cited

U.S. PATENT DOCUMENTS

| | | | |
|---|---|---|---|
| 5,936,293 A * | 8/1999 | Parkin ........................ 257/422 |
| 6,005,800 A | 12/1999 | Koch et al. |
| 6,114,719 A | 9/2000 | Dill et al. |
| 6,178,131 B1 * | 1/2001 | Ishikawa et al. ......... 365/225.7 |
| 6,335,890 B1 | 1/2002 | Reohr et al. |
| 6,368,878 B1 | 4/2002 | Abraham et al. |
| 6,430,084 B1 | 8/2002 | Rizzo et al. |
| 6,490,217 B1 | 12/2002 | DeBrosse et al. |
| 6,509,621 B1 | 1/2003 | Nakao |
| 6,522,579 B1 | 2/2003 | Hoenigschmid |
| 6,567,299 B1 | 5/2003 | Kunikiyo et al. |
| 6,590,803 B1 | 7/2003 | Saito et al. |
| 6,594,191 B1 | 7/2003 | Lammers et al. |
| 6,621,731 B1 | 9/2003 | Bessho et al. |
| 6,661,689 B1 | 12/2003 | Asao et al. |
| 6,667,899 B1 | 12/2003 | Subramanian et al. |
| 6,693,822 B1 | 2/2004 | Ito |
| 6,693,826 B1 | 2/2004 | Black, Jr. et al. |
| 6,714,445 B1 * | 3/2004 | Farrar ........................ 365/171 |

OTHER PUBLICATIONS

A. Anguelouch et al., "Two-dimensional magnetic switching of micron-size films in magnetic tunnel junctions", Applied Physics Letters, Jan. 31, 2000, pp. 622-624, vol. 76, No. 5, American Institute of Physics.

* cited by examiner

*Primary Examiner*—VanThu Nguyen
(74) *Attorney, Agent, or Firm*—Haynes and Boone, LLP

(57) ABSTRACT

An MRAM cell including an MRAM cell stack located over a substrate and first and second write lines spanning at least one side of the MRAM cell stack and defining a projected region of intersection of the MRAM cell stack and the first and second write lines. The MRAM cell stack includes a pinned layer, a tunneling barrier layer, and a free layer, the tunneling barrier layer interposing the pinned layer and the free layer. The first write line extends in a first direction within the projected region of intersection. The second write line extends in a second direction within the projected region of intersection. The first and second directions are angularly offset by an angle ranging between 45 and 90 degrees, exclusively. At least one write line may be perpendicular to the easy axis of free layer, while the other line may be rotated off the easy axis of the free layer by an angle which is larger than zero, such as to compensate for a shifting astroid curve.

20 Claims, 3 Drawing Sheets

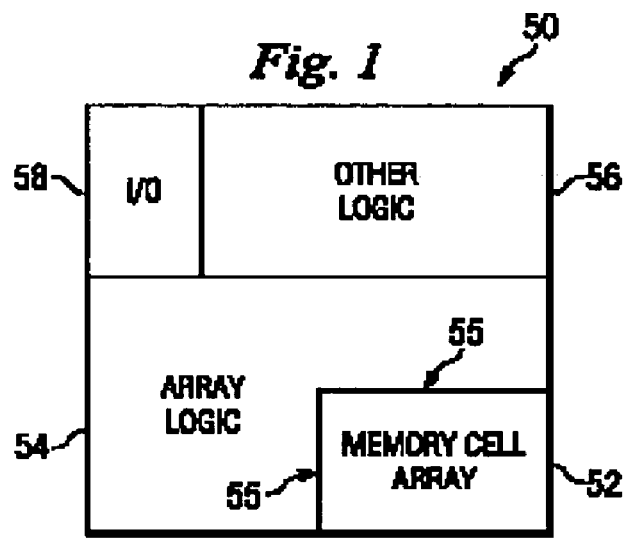
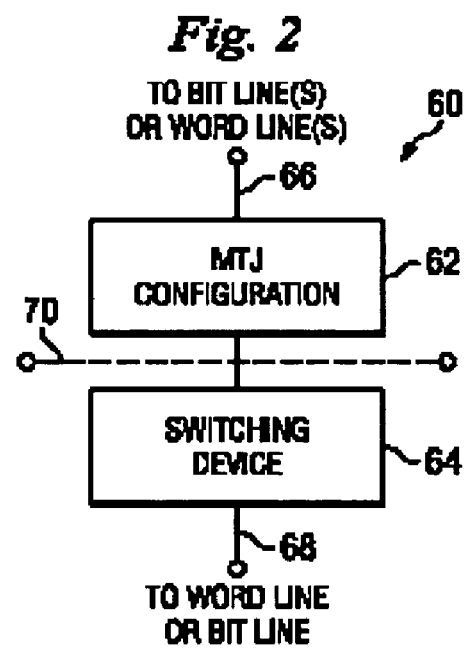

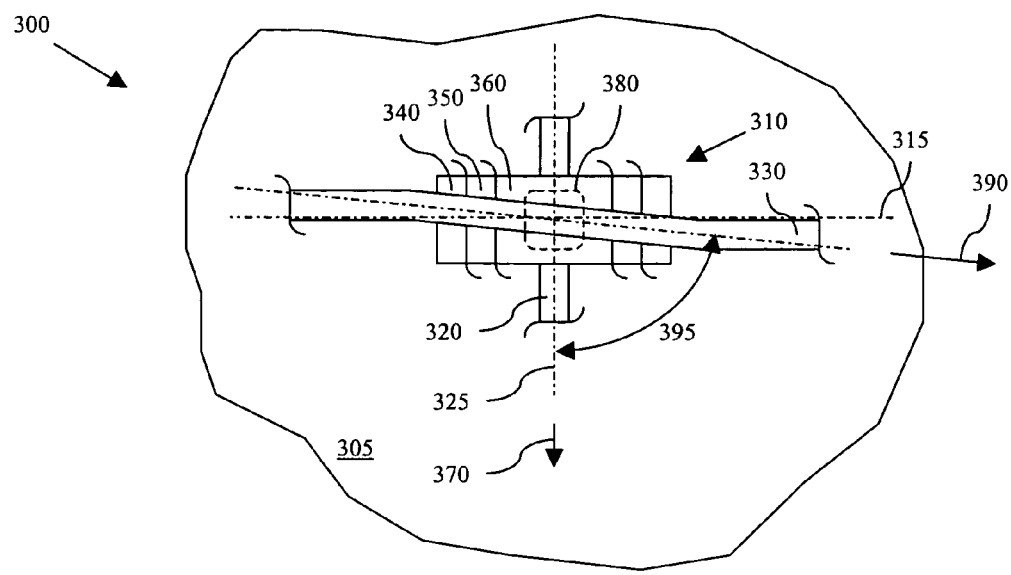
Fig. 3
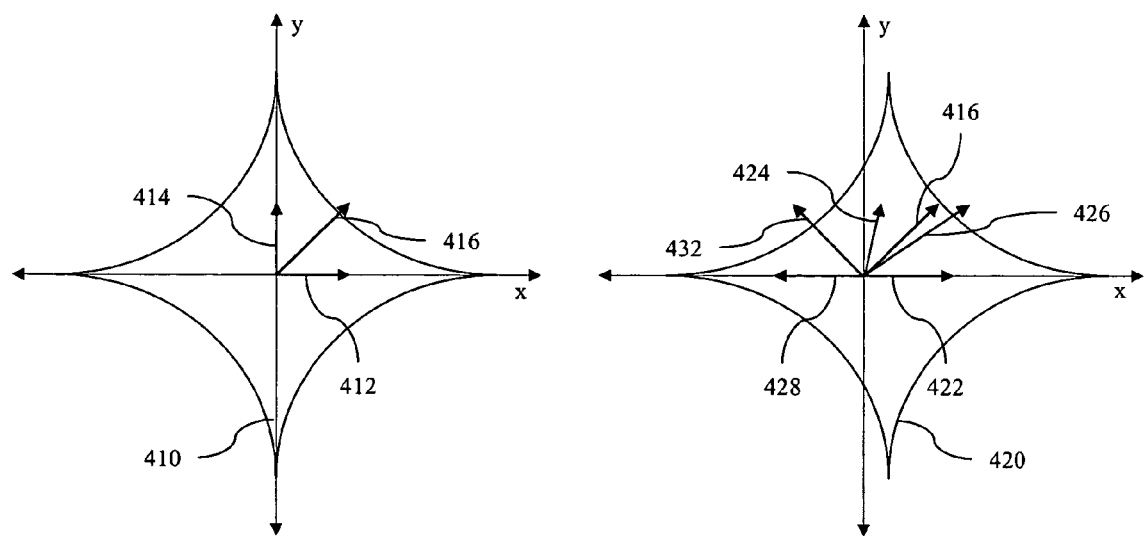
Fig. 4A
Fig. 4B

NON-ORTHOGONAL WRITE LINE STRUCTURE IN MRAM

CROSS-REFERENCE

This application is related to the following commonly-assigned U.S. Patent Applications, the entire disclosures of which are hereby incorporated herein by reference:

"MULTI-SENSING LEVEL MRAM STRUCTURES," Ser. No. 10/685,824, filed Oct. 13, 2003, having Wen Chin Lin and Denny D. Tang named as inventors.

"MULTI-SENSING LEVEL MRAM STRUCTURE WITH DIFFERENT MAGNETO-RESISTANCE RATIOS," Ser.No. 10/687,699, filed Oct. 3, 2003, having Wen Chin Lin and Denny D. Tang named as inventors.

This application is also related to the following commonly-assigned U.S. Patent Applications:

"NON-PARALLEL MAGNETIC FIELD WITH RESPECT TO LONG AXIS OF FREE LAYER OF MRAM CELL," Ser.No. 11/030,453, having Wen Chin Lin, Denny D. Tang and Li-Shyue Lai named as inventors.

BACKGROUND

Magnetic random access memory (MRAM) cells are often based on a magnetic tunnel junction (MTJ) cell comprising at least three basic layers: a "free" ferromagnetic layer, an insulating tunneling barrier, and a "pinned" ferromagnetic layer. In the free layer, magnetization moments are free to rotate under an external magnetic field, but the magnetic moments in the "pinned" layer are not. The pinned layer may comprise a ferromagnetic material and/or an anti-ferromagnetic material which "pins" the magnetic moments in the ferromagnetic layer. A thin insulation layer forms a tunneling barrier between the pinned and free magnetic layers.

In order to sense states in the MTJ configuration, a constant current can be applied through the cell. As the magneto-resistance varies according to the state stored in the cell, the voltage over the memory cell can be sensed. To write or change the state in the memory cell, an external magnetic field can be applied that is sufficient to completely switch the direction of the magnetic moments of the free magnetic layer.

A Tunneling Magneto-Resistance (TMR) effect is often utilized in conventional MTJ configurations. The TMR effect allows magnetic moments to switch directions in a magnetic layer in response to exposure to an external magnetic field. By utilizing the TMR effect, the magneto-resistance (MR) of an MTJ configuration may be altered. MR is a measure of the ease with which electrons may flow through the free layer, the tunneling barrier, and the pinned layer. A minimum MR occurs in an MTJ configuration when the magnetic moments in both magnetic layers have the same direction or are "parallel." A maximum MR occurs when the magnetic moments of both magnetic layers are in opposite directions or are "anti-parallel."

The most common structure for writing to MRAM cells comprises a set of orthogonal write lines, wherein one write line is parallel to the easy axis of the corresponding MRAM cell and the other write line is perpendicular to easy axis (or parallel to the hard axis). An electrical current is introduced to the write line to create the magnetic field necessary to change the direction of the free layer magnetization. However, the path of the resulting magnetic flux of the MRAM cell free layer or pinned layer does not form a closed loop. Consequently, the magnetic flux causes a shift in the corresponding B-H loop and asteroid curve. Increased surface roughness of one or more of the free layer, pinned layer, and tunneling barrier also causes a shift in the corresponding B-H loop and asteroid curve. The shift in the asteroid curve leads to an asymmetric writing threshold, or a switching threshold shift, resulting in bit errors and reducing performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a block diagram of one embodiment of an integrated circuit device having a memory cell array according to aspects of the present disclosure.

FIG. 2 is a block diagram of one embodiment of a memory cell for use in the memory cell array shown in FIG. 1 according to aspects of the present disclosure.

FIG. 3 is a plan view of one embodiment of a portion of a magnetic random access memory (MRAM) cell constructed according to aspects of the present disclosure.

FIGS. 4A and 4B are graphs of asteroid curves pertinent to aspects of the present disclosure.

DETAILED DESCRIPTION

Figure 5:
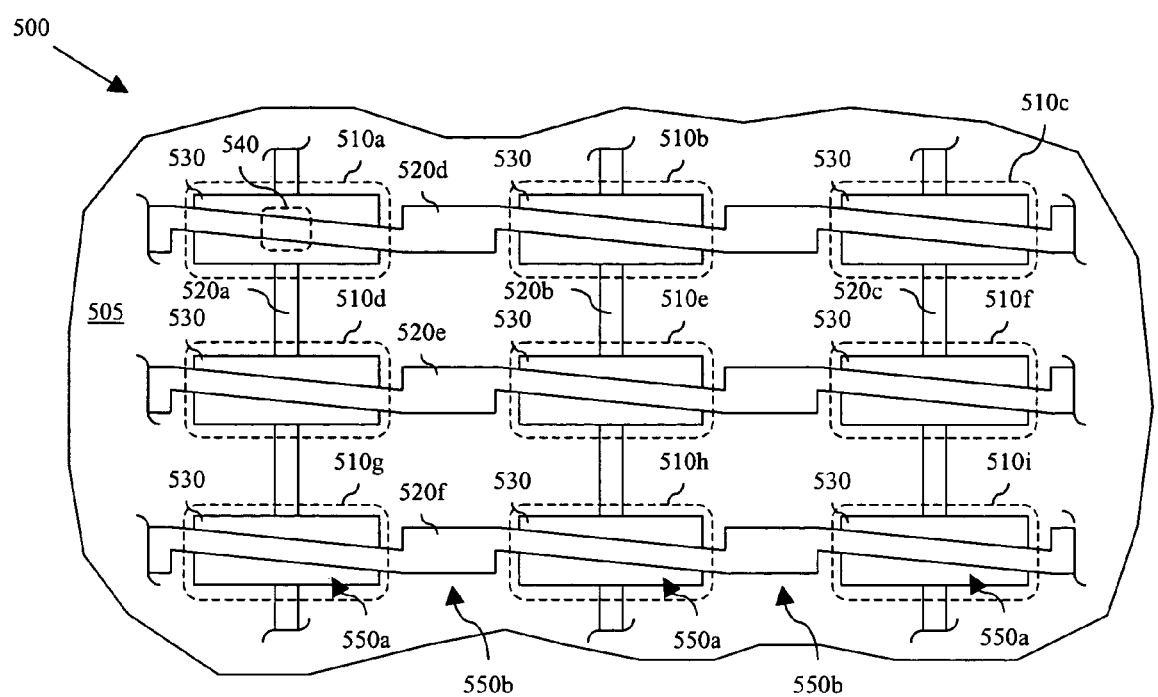
FIG. 5 is a sectional view of one embodiment of an integrated circuit device constructed according to aspects of the present disclosure.

The present disclosure relates generally to magnetic random access memory (MRAM) devices and, more specifically, to an MRAM cell having a non-orthogonal write line structure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a block diagram of one embodiment of an integrated circuit 50 that is one example of a circuit that can benefit from aspects of the present disclosure. The integrated circuit 50 includes a memory cell array 52 that can be controlled by an array logic 54 through an interface 55. It is well known in the art that various logic circuitry, such as row and column decoders and sense amplifiers, can be included in the array logic 54, and that the interface 55 may include one or more bit lines, gate lines, digit lines, control lines, word lines, and other communication paths to interconnect the memory cell array 52 with the array logic 54. These communication paths will hereinafter be referred to as bit lines or word lines, it being understood that different applications of the present disclosure may use different communication paths. The integrated circuit can further include other logic 56, such as counters, clock circuits, and processing circuits, and input/output circuitry 58, such as buffers and drivers.

Referring to FIG. 2, the memory cell array 52 of FIG. 1 may include one or more magnetic random access memory (MRAM) cells 60. Each MRAM cell 60 does not need to be commonly configured, but for the sake of example, can be generically described as including a configuration of MTJ devices 62 and a switching device 64. Examples of various embodiments of the MTJ devices 62 are discussed in further detail below, and examples of the switching device 64 include a metal oxide semiconductor (MOS) transistor, an MOS diode, and/or a bipolar transistor. The memory cell 60 can store 1, 2, 3, 4 or more bits, but for the sake of further example, a two bit configuration will be discussed. Also, the present disclosure is applicable and/or readily adaptable to single and double junction MTJ devices with different MR ratios, where there can be four magneto-resistance levels. The different MR ratios may facilitate the capability of sensing at least four levels of magneto-resistance, and the capacity to store at least two bits.

The MRAM cell 60 may include three terminals, a first terminal 66, a second terminal 68, and a third terminal 70. For the sake of example, the first terminal 66 is connected to one or more bit lines and produces an output voltage in a read operation, which is provided to the bit line(s). The second terminal 68 is connected to one or more word lines, which can activate the cell 60 for a read or write operation. The third terminal 70 may be proximate a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only providing one example of such an arrangement.

Referring to FIG. 3, illustrated is a plan view of one embodiment of an MRAM cell 300 constructed according to aspects of the present disclosure. The MRAM cell 300 includes an MRAM cell stack 310, a first write line 320 and a second write line 330. The MRAM stack 310 includes a pinned layer 340 located over a substrate 305, a tunneling barrier layer 350 located over the pinned layer 340, and a free layer 360 located over the tunneling barrier layer 350. However, in other embodiments, the order of the layers in the MRAM stack 310 may be altered, such as in embodiments in which the tunneling barrier layer 350 is located over the free layer 360, and the pinned layer 340 is located over the tunneling barrier layer 350.

The pinned layer 340 may comprise a ferromagnetic material wherein magnetic dipoles and moments are magnetically "pinned." For example, an adjacent or proximate pinning layer may comprise an anti-ferromagnetic layer or an anti-ferromagnetic exchange layer. In one embodiment, the pinned layer 340 comprises NiFe, NiFeCo, CoFe, Fe, Co, Ni, alloys or compounds thereof, and/or other ferromagnetic materials. The pinned layer 340 may also comprise a plurality of layers. For example, the pinned layer 340 may comprise a Ru spacer layer interposing two or more ferromagnetic layers. Thus, the pinned layer 340 may be or comprise a synthetic anti-ferromagnetic (SAF) layer. The pinned layer 340 may be formed by chemical-vapor deposition (CVD), plasma-enhanced CVD (PECVD), atomic layer deposition (ALD), physical-vapor deposition (PVD), electrochemical deposition, molecular manipulation, and/or other processes.

The tunneling barrier 350 may comprise $SiO_x$, $SiN_x$, $SiO_xN_y$, $AlO_x$, $TaO_x$, $TiO_x$, $AlN_x$, and/or other non-conductive materials. In one embodiment, the tunneling barrier 350 may be formed by CVD, PECVD, ALD, PVD, electrochemical deposition, molecular manipulation, and/or other processes. The tunneling barrier 350 may electrically insulate the pinned layer 340 from the free layer 360 independently or in conjunction with other layers interposing the pinned and free layers 340, 360.

The free layer 360 may be substantially similar in composition and manufacture to the pinned layer 340. For example, the free layer 360 may comprise NiFe, NiFeCo, CoFe, Fe, Co, Ni, alloys/compounds thereof, and/or other ferromagnetic materials, and may be formed by CVD, PECVD, ALD, PVD, electro-chemical deposition, molecular manipulation, and/or other processes. However, the free layer 360 may not be adjacent an antiferromagnetic material, such that the free layer 360 may not be pinned. For example, the magnetic dipoles in the free layer 360 may be aligned in more than one direction. In one embodiment, the free layer 360 comprises a plurality of layers, such as a Ru spacer layer interposing two or more ferromagnetic layers. Thus, the free layer 360 may also be or comprise an SAF layer.

The locations of the free layer 360 and the pinned layer 340 relative to the tunneling barrier 350 may be switched. For example, as discussed above, the MRAM stack 310 may include the free layer 360 located over the substrate 305, the tunneling barrier layer 350 located over the free layer 360, and the pinned layer 340 located over the tunneling barrier layer 350.

The first write line 320 extends under the MRAM cell stack 310 in a first direction 370 within a projected region of intersection 380 of the MRAM cell stack 310 and the first and second write lines 320, 330. The first direction 370 may be substantially perpendicular to the MRAM cell stack 310, or to the easy axis of the stack 310. In general, that is, the longitudinal axis 315 of the MRAM cell stack 310 and the longitudinal axis 325 of the first write line 320 may be substantially perpendicular. However, in other embodiments, the first direction 370 may not be perpendicular to the easy axis 315 of the MRAM cell stack 310. For example, the first direction 370 may be angularly offset from the MRAM cell stack axis 315 by an offset angle ranging between about 45 degrees and about 89 degrees.

The second write line 330 extends over the MRAM cell stack 310 in a second direction 390 within the projected region of intersection 380. The first and second directions 370, 390 are angularly offset by an angle ranging between 45 and 90 degrees, exclusively. That is, the first and second directions 370, 390 are substantially non-perpendicular, being angularly offset by an offset angle 395 that does not equal 45 degrees or 90 degrees. In the illustrated embodiment, the offset angle 395 is about 85 degrees. In another embodiment, an angular offset between the second direction 390 and the MRAM cell stack axis 315 may be less than about 45 degrees, but not equal to 0 degrees. The direction and/or magnitude of the angular offset between the first and second directions 370, 390 may also be based on or correspond to a switching threshold shift of the MRAM cell stack 310.

In short, the first write line 320 is perpendicular to the easy axis 315 of the MRAM cell stack 310, and the angular offset between the easy axis 315 and the second direction 390 ranges between about 0 degrees and about 45 degrees. For example, the angular offset between the easy axis 315 and the second direction 390 may be about 5 degrees. Consequently, the angle 395 may be about 85 degrees.

The write lines 320, 330 may be electrically conductive bit- or word-lines in a memory cell array or other integrated circuit. In one embodiment, one or both of the write lines 320, 330 include a bulk conductor and a cladding layer. The bulk conductor may be formed by CVD, PECVD, ALD, PVD, electrochemical deposition, molecular manipulation, and/or-other processes, and may comprise Cu, Al, Ag, Au, W, alloys/compounds thereof, and/or other materials. The bulk conductor may also include a barrier layer comprising Ti, Ta, TiN, TaN, WN, SiC, and/or other materials. The cladding layer may surround a substantial portion of the perimeter of the bulk conductor. For example, the bulk conductor may have a four-sided perimeter and the cladding layer may substantially surround or cover three of the four sides of the bulk conductor perimeter. In other embodiments, the cladding layer may substantially encompass the perimeter of the bulk conductor. The cladding layer may be substantially similar in composition and manufacture to the free layer 360. For example, the cladding layer may comprise at least one of NiFe, NiFeCo, CoFe, Fe, Co, Ni, alloys/compounds thereof, and/or other ferromagnetic materials, and may be formed by CVD, PECVD, ALD, PVD, electrochemical deposition, molecular manipulation, and/or other processes.

Referring to FIGS. 4A and 4B, illustrated are graphs depicting asteroid curves 410, 420. In general, asteroid curves corresponding to AM cells represent the magnitude of the magnetic field resulting when a first magnetic field parallel to the MRAM cell easy axis and a second magnetic field perpendicular to the easy axis direction are applied at once. The first and second magnetic fields may be generated by current flow through bit, word, and/or digit lines connected to or passing near the MRAM cell. In FIGS. 4A and 4B, the easy axis is parallel to the x-axis of the graph. Magnetization reversal can occur when the distal end of a resultant magnetic field vector extends outside the asteroid curve.

The asteroid curve 410 may represent ideal conditions in which the first and second magnetic fields, represented by the vectors 412, 414, are perpendicular and are not affected by each other or other proximate magnetic fields. According, in this example, the magnetic fields represented by the vectors 412, 414 are sufficient to cause a magnetization reversal of the free layer in the corresponding MRAM cell because the resultant magnetic field, represented by the vector 416, extends beyond the asteroid curve 410.

As discussed above, the asteroid curve for some MRAM cell configurations can be skewed off-center, such that the switching threshold may be shifted, whereby the resultant magnetic field represented by vector 416 may be insufficient to reverse magnetization. The asteroid curve 420 may represent such an offset. However, at least one embodiment of an MRAM cell of the present disclosure includes first and second magnetic fields that are non-perpendicular, such as may result from orienting associated bit/word/digit lines non-perpendicularly. Such first and second magnetic fields are represented in FIG. 4B by vectors 422, 424. Consequently, the resultant field to "write a 1" to such an MRAM cell, which is represented in FIG. 4B by the vector 426, may be skewed in the direction of the offset of the asteroid curve 420. Moreover, the magnetic fields required to "write a 0" to such an MRAM cell, represented in FIG. 4B by the vectors 428, 424, may have the same magnitudes as those required to "write a 1" to the MRAM cell, and the resultant vector 432 may still extend beyond the asteroid curve 420.

Referring to FIG. 5, illustrated is a plan view of one embodiment of an integrated circuit device 500 in an intermediate stage of manufacture according to aspects of the present disclosure. The integrated circuit device 500 is one environment in which the MRAM cell 300 discussed above may be implemented. For example, the integrated circuit device 500 includes a plurality of memory cells 51a–i, ones of which may be substantially similar to the MRAM cell 300 shown in FIG. 3. The memory cells 510 each include an MRAM cell stack 530, and may collectively form a memory cell array, including a one-, two- or three-dimensional array, and may be oriented in one or more rows and/or one or more columns, such as on or over a substrate 505. The substrate 505 may be substantially planar or substantially spherical, and/or may have a spherical or otherwise rounded surface on, over or from which the plurality of MRAM cells 510a–i may be formed.

The integrated circuit device 500 also includes one or more write lines that may interconnect ones of the plurality of memory cells 510a–i. For example, in the illustrated embodiment, a write line 520a interconnects memory cells 510a, 510d and 510g, a write line 520b interconnects memory cells 510b, 510e and 510h, and a write line 520c interconnects memory cells 510c, 510f and 510i. The illustrated embodiment also includes a write line 520d interconnecting memory cells 510a–c, a write line 520e interconnecting memory cells 510d–f and a write line 520f interconnecting memory cells 510g–i. Each of the write lines 520a–f may include a plurality of members, sections or elements (hereafter collectively referred to as sections) that are each angularly offset from neighboring sections. For example, in the illustrated embodiment, the illustrated portion of the write lines 520d–f include sections 550a extending in a first direction and sections 550b extending in a second direction. The write lines 520a–f may be substantially similar in composition and manufacture to one or more of the write lines 320, 330 discussed above with respect to FIG. 3. The write lines 520a–c may interpose the MRAM cell stacks 530 and the substrate 505, and the write lines 520d–f may be opposite the MRAM cell stacks 530 from the write lines 520a–c.

The portions of the write lines 520d–f passing proximate the MRAM cell stacks 530 are angularly offset from the corresponding portions of the write lines 520a–c passing proximate the MRAM cell stacks 530 (e.g., in a projected region of intersection 540 of the write lines 520a, 520d). Each of the memory cells 510a–i may have corresponding portions of write lines similarly oriented. However, neighboring ones or groups of the memory cells 510a–i need not have similarly oriented pairs of write lines. Moreover, each of the write lines 520d–f need not be similarly oriented to corresponding portions of write lines 520a–c at any one of the MRAM cell stacks 530 by which the write lines 520d–f pass. Thus, the write lines 520a–f may have similar or different saw-tooth-shaped profiles (such as the write lines 520d–f in FIG. 5) or other zigzag-shaped or other oscillating, undulating or serrated profiles. Such profiles may also be regular (e.g., periodic) or irregular.

Thus, the present disclosure introduces an MRAM cell comprising, in one embodiment, an MRAM cell stack located over a substrate and first and second write lines spanning opposing sides of the MRAM cell stack and defining a projected region of intersection of the MRAM cell stack and the first and second write lines. The MRAM cell stack includes a pinned layer, a tunneling barrier layer, and a free layer, the tunneling barrier layer interposing the pinned and free layers. The first write line extends in a first direction within the projected region of intersection, and the second write line extends in a second direction within the projected region of intersection. The first and second directions are angularly offset by an angle ranging between 0 and 90 degrees, exclusively. I one embodiment, the first and second directions are angularly offset by about 85 degrees.

The present disclosure also introduces a method of manufacturing an MRAM cell. In one embodiment, the method includes forming an MRAM cell stack over a substrate and forming first and second write lines spanning opposing sides of the MRAM cell stack, the first and second write lines defining a projected region of intersection of the MRAM cell stack and the first and second write lines. The MRAM cell stack includes a pinned layer, a tunneling barrier layer, and a free layer, the tunneling barrier layer interposing the pinned and free layers. The first write line extends in a first direction within the projected region of intersection, and the second write line extends in a second direction within the projected region of intersection. The first and second directions are angularly offset by an angle ranging between 0 and 90 degrees, exclusively.

An integrated circuit device is also provided in the present disclosure. In one embodiment, the integrated circuit device includes a plurality of magnetic random access memory (MRAM) cells located over a substrate and each including a pinned layer, a tunneling barrier layer, and a free layer, wherein the tunneling barrier layer interposes the pinned layer and the free layer. The integrated circuit device also includes a plurality of first and second write lines each spanning at least one side of ones of the plurality of MRAM cells, thereby defining a plurality of projected regions of intersection of ones of the plurality of MRAM cells and corresponding ones of the first and second write lines. One of the plurality of first write lines extends in a first direction within a corresponding one of the plurality of projected regions of intersection. One of the plurality of second write lines extends in a second direction within the corresponding one of the plurality of projected regions of intersection. The first and second directions are angularly offset by an offset angle ranging between about 45 and about 90 degrees, exclusively.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. For example, the first and second directions 370, 390 may be angularly offset by an angle ranging between 0 and 90 degrees, exclusively, or between about 15 degrees and about 75 degrees, inclusively. The first write line 320 may also not be perpendicular to the easy axis 315 of the MRAM cell stack 310 in the projected region of intersection 380, in contrast to the illustrated embodiments. For example, the first write line 320 may be angularly offset from the easy axis 315 of the MRAM cell stack 310 within the projected region of intersection 380 by an offset angle ranging between about 1 degrees and about 89 degrees. Thus, the second write line 330 may be substantially parallel to the easy axis 315 of the MRAM cell stack 310 within the projected region of intersection 380. The direction and/or magnitude of the angular offset of at least one of the first and second directions 370, 390 relative to the easy axis 315 of the MRAM cell stack 310 may also be based on or correspond to a switching threshold shift of the MRAM cell stack 310. Those skilled in the art should also realize that these and other such equivalent constructions do not depart from the spirit and scope of the present disclosure, and that they may make various changes, substitutions and alterations herein without departing from the spirit and scope of the present disclosure.

What is claimed is:

1. A magnetic random access memory (MRAM) cell, comprising:
  an MRAM cell stack located over a substrate and including a pinned layer, a tunneling barrier layer, and a free layer, the tunneling barrier layer interposing the pinned layer and the free layer; and
  first and second write lines spanning at least one side of the MRAM cell stack and defining a projected region of intersection of the MRAM cell stack and the first and second write lines;
  wherein the first write line extends in a first direction within the projected region of intersection;
  wherein the second write line extends in a second direction within the projected region of intersection, wherein the first and second directions are angularly offset by an offset angle ranging between 45 and 90 degrees, exclusively; and
  wherein neither of the first and second write lines is parallel to an easy axis of the MRAM cell stack within the projected region of intersection.

2. The MRAM cell of claim 1 wherein at least one of the first and second write lines includes a plurality of sections, each of the plurality of sections angularly offset from a neighboring one of the plurality of sections.

3. The MRAM cell of claim 1 wherein one of the first and second write lines is substantially perpendicular to an easy axis of the MRAM cell stack within the projected region of intersection.

4. The MRAM cell of claim 1 wherein the offset angle is greater than about 75 degrees.

5. The MRAM cell of claim 1 wherein at least one of a direction and magnitude of the angular offset relative to the substantially parallel orientation corresponds to a switching threshold shift.

6. The MRAM cell of claim 1 wherein at least one of the free layer and the pinned layer comprises a plurality of layers.

7. The MRAM cell of claim 1 wherein the first and second write lines span opposing sides of the MRAM cell stack.

8. An integrated circuit device, comprising:
  a plurality of magnetic random access memory (MRAM) cells located over a substrate and each including a pinned layer, a tunneling barrier layer, and a free layer, the tunneling barrier layer interposing the pinned layer and the free layer; and
  a plurality of first and second write lines each spanning at least one side of ones of the plurality of MRAM cells, thereby defining a plurality of projected regions of intersection of ones of the plurality of MRAM cells and corresponding ones of the first and second write lines;
  wherein one of the plurality of first write lines extends in a first direction within a corresponding one of the plurality of projected regions of intersection;
  wherein one of the plurality of second write lines extends in a second direction within the corresponding one of the plurality of projected regions of intersection;
  wherein the first and second directions are angularly offset by an offset angle ranging between about 45 and about 90 degrees, exclusively; and wherein at least one of the plurality of first and second write lines interconnects ones of the plurality of MRAM cells and has a zigzag-shaped profile.

9. The integrated circuit device of claim 8 wherein the interconnected ones of the plurality of MRAM cells are substantially aligned.

10. The integrated circuit device of claim 8 wherein the offset angle is greater than about 75 degrees.

11. The integrated circuit device of claim 8 wherein ones of the plurality of first and second write lines span opposing sides of ones of the plurality of MRAM cells.

12. The integrated circuit device of claim 8 wherein, for each of the plurality of MRAM cells, at least one of the first and second directions is angularly offset from an easy axis of a corresponding one of the plurality of MRAM cells, wherein at least one of a magnitude and direction of the angular offset corresponds to a switching threshold shift of the plurality of MRAM cells.

13. The integrated circuit device of claim 8 wherein at least one of the first and second directions is angularly offset from a substantially parallel orientation relative to an easy axis of a corresponding one of the plurality of MRAM cells.

14. A magnetic random access memory (MRAM) cell, comprising:
   an MRAM cell stack located over a substrate and including a pinned layer, a tunneling barrier layer, and a free layer, the tunneling barrier layer interposing the pinned layer and the free layer; and
   first and second write lines spanning at least one side of the MRAM cell stack and defining a projected region of intersection of the MRAM cell stack and the first and second write lines;
   wherein the first write line extends in a first direction within the projected region of intersection;
   wherein the second write line extends in a second direction within the projected region of intersection, wherein the first and second directions are angularly offset by an offset angle ranging between 45 and 90 degrees, exclusively; and
   wherein at least one of the first and second write lines includes a plurality of sections, each of the plurality of sections angularly offset from a neighboring one of the plurality of sections.

15. The MRAM cell of claim 14 wherein one of the first and second write lines is substantially perpendicular to an easy axis of the MRAM cell stack within the projected region of intersection.

16. The MRAM cell of claim 14 wherein the offset angle is greater than about 75 degrees.

17. The MRAM cell of claim 14 wherein one of the first and second directions is angularly offset from a substantially parallel orientation relative to an easy axis of the MRAM cell stack.

18. The MRAM cell of claim 17 wherein at least one of a direction and magnitude of the angular offset relative to the substantially parallel orientation corresponds to a switching threshold shift.

19. The MRAM cell of claim 14 wherein at least one of the free layer and the pinned layer comprises a plurality of layers.

20. The MRAM cell of claim 14 wherein the first and second write lines span opposing sides of the MRAM cell stack.

* * * * *